(12) United States Patent
Kim et al.

(10) Patent No.: US 7,364,600 B2
(45) Date of Patent: Apr. 29, 2008

(54) SLURRY FOR CMP AND METHOD OF POLISHING SUBSTRATE USING SAME

(75) Inventors: Dae Hyeong Kim, Gyeonggi-Do (KR); Seok Min Hong, Gyeonggi-Do (KR); Jae Hyun Jeon, Gyeonsangbuk-Do (KR); Ho Seong Kim, Gyeonggi-Do (KR); Hyun Soo Park, Gyeonggi-Do (KR); Un Gyu Paik, Seoul (KR); Jae Gun Park, Gyeonggi-Do (KR); Yong Kuk Kim, Seoul (KR)

(73) Assignees: K.C. Tech Co., Ltd., Anseong-si (KR); IUCF-HYU, Seoul (KR)

( * ) Notice: Subject to any disclaimer, the term of this patent is extended or adjusted under 35 U.S.C. 154(b) by 63 days.

(21) Appl. No.: 11/127,441

(22) Filed: May 11, 2005

(65) Prior Publication Data

US 2005/0252092 A1 Nov. 17, 2005

(30) Foreign Application Priority Data

May 11, 2004 (KR) ............... 10-2004-0033114
May 19, 2004 (KR) ............... 10-2004-0035455

(51) Int. Cl.
*C09G 1/02* (2006.01)
*C09G 1/04* (2006.01)

(52) U.S. Cl. ................... 51/307; 51/308; 51/309; 106/3

(58) Field of Classification Search .......... 51/307–309; 106/3
See application file for complete search history.

(56) References Cited

U.S. PATENT DOCUMENTS

| | | | |
|---|---|---|---|
| 5,772,780 A | 6/1998 | Homma et al. | |
| 6,043,155 A | 3/2000 | Homma et al. | |
| 6,221,118 B1 | 4/2001 | Yoshida et al. | |
| 6,299,659 B1 | 10/2001 | Kido et al. | |
| 6,343,976 B1 | 2/2002 | Yoshida et al. | |
| 6,387,139 B1 | 5/2002 | Kido et al. | |
| 6,407,000 B1 * | 6/2002 | Hudson | 438/693 |
| 6,410,444 B1 | 6/2002 | Kido et al. | |
| 6,420,269 B2 | 7/2002 | Matsuzawa et al. | |
| 6,436,835 B1 | 8/2002 | Kido et al. | |
| 6,478,836 B1 | 11/2002 | Kido et al. | |
| 6,615,499 B1 | 9/2003 | Matsuzawa et al. | |
| 2003/0061766 A1 * | 4/2003 | Vogt et al. | 51/308 |
| 2003/0104770 A1 * | 6/2003 | Pasqualoni et al. | 451/60 |

FOREIGN PATENT DOCUMENTS

KR 2005-0091476 9/2005

* cited by examiner

*Primary Examiner*—Michael Marcheschi
(74) *Attorney, Agent, or Firm*—Marger Johnson & McCollom PC

(57) ABSTRACT

Disclosed herein is a polishing slurry and a method of producing the same. The polishing slurry has high selectivity in terms of a polishing speed of an oxide layer to that of a nitride layer used in CMP of an STI process which is essential to produce ultra highly integrated semiconductors having a design rule of 256 mega D-RAM or more, for example, a design rule of 0.13 μm or less. A method and a device for pre-treating polishing particles, a dispersing device and a method of operating the dispersing device, a method of adding a chemical additive and an amount added, and a device for transferring samples are properly employed to produce a high performance nano ceria slurry essential to CMP for a process of producing ultra highly integrated semiconductors of 0.13 μm or less, particularly, the STI process.

9 Claims, 6 Drawing Sheets

SLURRY FOR CMP AND METHOD OF POLISHING SUBSTRATE USING SAME

BACKGROUND OF THE INVENTION

1. Field of the Invention

The present invention relates to a polishing slurry, particularly, chemical mechanical polishing (hereinafter, referred to as 'CMP'). More particularly, the present invention pertains to a method of producing a high performance slurry which has high selectivity in terms of a polishing speed of an oxide layer to that of a nitride layer used in a CMP process needed to fabricate ultra highly integrated semiconductors of 256 mega D-RAM or more (Design rule of 0.13 µm or less) and which decreases the occurrence of scratches, and a method of polishing a substrate using the same.

2. Description of the Related Art

CMP is a semiconductor processing technology in which a mechanical process using polishing particles between a pressed wafer and a polishing pad and chemical etching using a slurry are simultaneously conducted, and has been an essential process of global planarization technology in the production of submicron-scaled semiconductor chips since IBM Co., Ltd. in the USA developed it at the end of the 1980's.

A description will be given of a CMP process and a slurry needed for this process, with reference to FIGS. 1a to 1c. The CMP process, in which an uneven portion of a surface of a wafer is smoothed in a semiconductor process, is a process where, after the surface of the wafer is chemically transformed by an acidic or basic solution of the slurry to instantaneously form a layer weakly bonded to the surface, the layer thus formed is mechanically removed using particles in the slurry. In other words, the wafer is pressed while the slurry is provided to the surface of the wafer, thereby mechanically polishing the surface of the wafer using the particles in the slurry.

To conduct the CMP process, a head 3, on which a wafer 1 is to be mounted, a pad 4 rotating in the same direction as the head, and a slurry 2 provided between them, containing nano-sized polishing particles, are prepared. The wafer 1 is mounted on a wafer chuck 7 of the head 3 by surface tension or vacuum pressure. In the CMP process, the wafer 1 is polished by the pad 4 and the slurry 2. A polishing table 5, to which the pad 4 is attached, merely rotates, but the head 3 simultaneously rotates and reciprocates while deviating from the center of rotation of the polishing table 5. At the same time, the wafer 1 is pressed toward the polishing table 5 with a predetermined pressure. The surface of the wafer 1 comes into contact with the pad 4 due to the weight of the head and applied pressure, and the slurry flows into fine gaps in the interface, that is to say, the pores 8 of the pad. Mechanical polishing is achieved by polishing particles of the slurry and surface protrusions 9 of the pad 4, and chemical polishing is achieved by chemical components of the slurry. Furthermore, upper sides of projections of the wafer 1, in which devices are formed, first come into contact with the polishing particles or the surface protrusions, and pressure is concentrated on the projections of the wafer. Accordingly, the projections are removed at relatively high surface removal speed, resulting in uniform removal of the projections.

The types of slurry are roughly classified into a slurry for oxide, a slurry for metal, and a slurry for poly-silicon according to the type of object to be polished. The slurry for oxide is used to polish an interlayer insulating film and a silicon oxide ($SiO_2$) layer employed in an STI (shallow trench isolation) process, and roughly comprises polishing particles, deionized water, a pH stabilizer, and a surfactant. The polishing particles function to mechanically polish the surface of the object by means of pressure from a polishing machine, and are exemplified by silica ($SiO_2$), ceria ($CeO_2$), and alumina ($Al_2O_3$). Particularly, ceria slurry is frequently used to polish the silicon oxide layer during the STI process, and in this case, a silicon nitride layer is mainly used as a polishing stopper layer.

Usually, an additive is added to the ceria slurry to reduce the removal speed of the nitride layer so as to improve the polishing speed selectivity of the oxide layer to the nitride layer. However, the use of the additive is disadvantageous in that the removal speed of the oxide layer, as well as the removal speed of the nitride layer, is reduced. Furthermore, the polishing agent of the ceria slurry typically has particles larger than those of the silica slurry, and therefore scratches the surface of the wafer.

However, if polishing speed selectivity of the oxide layer to the nitride layer is low, a dishing phenomenon, in which an excessive volume of the oxide layer is removed, occurs due to the loss of adjacent nitride layer patterns. Thus, it is impossible to achieve uniform surface flattening.

Accordingly, the slurry for STI CMP requires high selectivity and polishing speed, dispersion and micro-scratch stabilities, and narrow and uniform particle size distribution. Additionally, the number of large particles having the size of 1 µm or more must exist within a predetermined range.

With respect to conventional technology of producing the slurry for STI CMP, U.S. Pat. Nos. 6,221,118 and 6,343,976, granted to Hitachi Inc., disclose a method of synthesizing ceria particles and a method of producing a slurry having high selectivity using the same. These patents describe characteristics of particles required in the slurry for STI CMP, the type of additives containing polymer, and the production method using them in very critical and wide ranges. Particularly, the patents suggest wide ranges of an average grain size, an average primary particle size, and an average secondary particle size. In another conventional technology, U.S. Pat. No. 6,420,269, granted to Hitachi Inc., discloses a method of synthesizing various ceria particles and a method of producing a slurry having high selectivity using the same. Furthermore, in the prior arts, U.S. Pat. Nos. 6,436,835, 6,299,659, 6,478,836, 6,410,444, and 6,387,139, which have been made by Showa Denko Co. Ltd. in Japan, disclose a method of synthesizing ceria particles and a method of producing a slurry having high selectivity using the same. These patents mostly describe the types of additives added to the slurry, effects due to them, and a coupling agent.

However, the above-mentioned conventional technologies just disclose average particle sizes of the polishing particles which constitute the polishing slurry and their ranges, but do not control the large polishing particles that cause micro-scratches in practice. Thus, it is problematic in that it is impossible to suppress the occurrence of micro-scratches caused by the large particles in the slurry.

Additionally, the conventional technologies do not mention analysis for the number of large particles depending on a solid load (weight percent), that is, an amount (concentration) of solid polishing particles, of the slurry. Hence, it is problematic in that it is impossible to suppress the occurrence of many micro-scratches.

SUMMARY OF THE INVENTION

Accordingly, the present invention has been made keeping in mind the above problems occurring in the prior art, and an object of the present invention is to provide a method of producing a high performance nano ceria slurry essential to a CMP process, in which a method and a device for pre-treating particles, a dispersing device and a method of operating the dispersing device, a method of adding a chemical additive and an amount added, and a device for transferring samples are properly employed, and a method of polishing a substrate using the same. Particularly, a solid load of the slurry is controlled to adjust a CMP removal rate and the occurrence of scratches, thereby providing a slurry which is capable of minimizing the frequency of occurrence of micro-scratches which rapidly increases as a design rule is reduced.

Another object of the present invention is to provide an optimum slurry for CMP and a method of producing the same, based on analysis of the number of large particles depending on a change in a solid load (the number of large particles in a specific size region per unit volume), a grain size, a first particle size, a second particle size, a particle size distribution, a change in the pH and conductivity, dispersion stability depending on the degree of aging and additives, and viscosity through characteristic analysis of polishing particles and slurry.

Still another object of the present invention is to provide a slurry. In the slurry, an optimum point of the solid load which is required during the production and storage of the polishing slurry is set by controlling the dispersion stability and the number of large particles depending on a solid load, the appropriate solid load is determined in consideration of a change in the number of large particles depending on the solid load of the slurry and of ease of agglomeration and re-dispersion depending on the solid load, and dispersion stability is maximized in consideration of the kind and amount of dispersing agent and the degree of aging.

In order to accomplish the above objects, the present invention provides a polishing slurry comprising polishing particles dispersed therein. The number of large polishing particles among the polishing particles is controlled depending on a solid load of the slurry and sizes of the polishing particles. The slurry of the present invention is characterized in that the number of large polishing particles decreases as the solid load of the slurry is reduced, and a decrease rate of the number of the large polishing particles, which depends on reduction of the solid load of the slurry, increases as particle size increases. Particularly, the decrease rate of the number of the large polishing particles rapidly increases depending on the reduction of the solid load. That is to say, when the solid load is reduced by half, the decrease rate of the number of large polishing particles is ½ or more. Furthermore, this tendency becomes significant as the size of the large particles increases, and a change in the number of large particles is relatively low when the particle size is small.

Additionally, in the slurry of the present invention, a cumulative particle number of polishing particles having a particle size of 1 µm or more is $1\times10^{10}$/ml or less, the cumulative particle number of polishing particles having a particle size of 2 µm or more is $1\times10^{9}$/ml or less, and the cumulative particle number of polishing particles having a particle size of 3 µm or more is $1\times10^{7}$/ml or less.

As well, in the slurry of the present invention, the polishing particles have a particle size distribution including separated fine and large polishing particle peaks regardless of the solid load.

Furthermore, in the present invention, when the solid load of the slurry is 8~12 wt %, the cumulative number of polishing particles having a particle size of 0.99 µm or more is $1\times10^{10}$/ml or less, the cumulative number of polishing particles having a particle size of 1.99 µm or more is $1\times10^{9}$/ml or less, and the cumulative number of polishing particles having a particle size of 2.99 µm or more is $1\times10^{7}$/ml or less. When the solid load of the slurry is 6~8 wt %, the cumulative number of polishing particles having a particle size of 0.99 µm or more is $1\times10^{10}$/ml or less, the cumulative number of polishing particles having a particle size of 1.99 µm or more is $5\times10^{8}$/ml or less, and the cumulative number of polishing particles having a particle size of 2.99 µm or more is $1\times10^{6}$/ml or less. When the solid load of the slurry is 4~6 wt %, the cumulative number of polishing particles having a particle size of 0.99 µm or more is $1\times10^{10}$/ml or less, the cumulative number of polishing particles having a particle size of 1.99 µm or more is $1\times10^{8}$/ml or less, and the cumulative number of polishing particles having a particle size of 2.99 µm or more is $1\times10^{5}$/ml or less. When the solid load of the slurry is 2~4 wt %, the cumulative number of polishing particles having a particle size of 0.99 µm or more is $5\times10^{9}$/ml or less, the cumulative number of polishing particles having a particle size of 1.99 µm or more is $5\times10^{7}$/ml or less, and the cumulative number of polishing particles having a particle size of 2.99 µm or more is $1\times10^{4}$/ml or less.

When the solid load of the slurry is 0.5~2 wt %, the cumulative number of polishing particles having a particle size of 0.99 µm or more is $5\times10^{9}$/ml or less, the cumulative number of polishing particles having a particle size of 1.99 µm or more is $1\times10^{7}$/ml or less, and the cumulative number of polishing particles having a particle size of 2.99 µm or more is $5\times10^{3}$/ml or less.

Furthermore, the preferable range of the number of large particles depending on the particle size of the slurry according to the present invention is as follows. When the solid load of the slurry is 8~12 wt %, the cumulative number of polishing particles having a particle size of 0.99 µm or more is $5\times10^{9}$/ml or less, the cumulative number of polishing particles having a particle size of 1.99 µm or more is $5\times10^{8}$/ml or less, and the cumulative number of polishing particles having a particle size of 2.99 µm or more is $5\times10^{6}$/ml or less. When the solid load of the slurry is 6~8 wt %, the cumulative number of polishing particles having a particle size of 0.99 µm or more is $5\times10^{9}$/ml or less, the cumulative number of polishing particles having a particle size of 1.99 µm or more is $1\times10^{8}$/ml or less, and the cumulative number of polishing particles having a particle size of 2.99 µm or more is $5\times10^{5}$/ml or less. When the solid load of the slurry is 4~6 wt %, the cumulative number of polishing particles having a particle size of 0.99 µm or more is $5\times10^{9}$/ml or less, the cumulative number of polishing particles having a particle size of 1.99 µm or more is $5\times10^{7}$/ml or less, and the cumulative number of polishing particles having a particle size of 2.99 µm or more is $5\times10^{4}$/ml or less. When the solid load of the slurry is 2~4 wt %, the cumulative number of polishing particles having the particle size of 0.99 µm or more is $1\times10^{9}$/ml or less, the cumulative number of polishing particles having the particle size of 1.99 µm or more is $1\times10^{7}$/ml or less, and the cumulative number of polishing particles having a particle size of 2.99 µm or more is $5\times10^{3}$/ml or less. When the solid load of the slurry is 0.5~2 wt %, the cumulative number of polishing particles having a particle size of 0.99 µm or more is $1 \times 10^9$/ml or less, the cumulative number of polishing particles having a particle size of 1.99 µm or more is $5 \times 10^6$/ml or less, and the cumulative number of polishing particles having a particle size of 2.99 µm or more is $1 \times 10^3$/ml or less.

Furthermore, the more preferable range of the number of large particles depending on the particle size of the slurry according to the present invention is as follows. When the solid load of the slurry is 8~12 wt %, the cumulative number of polishing particles having a particle size of 0.99 µm or more is $1 \times 10^9$/ml or less, the cumulative number of polishing particles having a particle size of 1.99 µm or more is $1 \times 10^8$/ml or less, and the cumulative number of polishing particles having a particle size of 2.99 µm or more is $1 \times 10^6$/ml or less.

When the solid load of the slurry is 6~8 wt %, the cumulative number of polishing particles having a particle size of 0.99 µm or more is $1 \times 10^9$/ml or less, the cumulative number of polishing particles having a particle size of 1.99 µm or more is $5 \times 10^7$/ml or less, and the cumulative number of polishing particles having a particle size of 2.99 µm or more is $1 \times 10^5$/ml or less. When the solid load of the slurry is 4~6 wt %, the cumulative number of polishing particles having a particle size of 0.99 µm or more is $1 \times 10^9$/ml or less, the cumulative number of polishing particles having a particle size of 1.99 µm or more is $1 \times 10^7$/ml or less, and the cumulative number of polishing particles having a particle size of 2.99 µm or more is $1 \times 10^4$/ml or less. When the solid load of the slurry is 2~4 wt %, the cumulative number of polishing particles having a particle size of 0.99 µm or more is $5 \times 10^8$/ml or less, the cumulative number of polishing particles having a particle size of 1.99 µm or more is $5 \times 10^6$/ml or less, and the cumulative number of polishing particles having a particle size of 2.99 µm or more is $1 \times 10^3$/ml or less. When the solid load of the slurry is 0.5~2 wt %, the cumulative number of polishing particles having a particle size of 0.99 µm or more is $5 \times 10^8$/ml or less, the cumulative number of polishing particles having a particle size of 1.99 µm or more is $1 \times 10^6$/ml or less, and the cumulative number of polishing particles having a particle size of 2.99 µm or more is $5 \times 10^2$/ml or less.

Additionally, in the slurry of the present invention, the polishing particles are ceria, and the ceria is produced through a solid-phase synthesis process. As well, the slurry comprises deionized water and an anionic polymer compound, and the anionic polymethacrylate selected from the group consisting of polymethacrylic acid, ammonium polymethacrylate. polycarboxylate, sodium dodecylsulfate, alkylbenzenesulfonate, alpha-olefinsulfonate, sodium salts of monoalkyl phosphate and fatty acid, and carboxyl-acryl polymer.

Meanwhile, the present invention provides a method of polishing a predetermined substrate using the slurry, and a silicon oxide film is formed on the predetermined substrate.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Hereinafter, a process of producing a polishing slurry according to the present invention and a characteristic analysis of the polishing slurry will be separately described in detail. Furthermore, a description will be given of a method of producing the polishing slurry using ceria as a polishing agent, deionized water as a dispersion medium thereof, and an anionic polymer dispersing agent as a dispersing agent. Additionally, a description will be given of the CMP results, such as an oxide film polishing speed and selectivity, depending on process conditions. Many modifications and variations of the present invention, which will be described later, are possible, and the scope of the present invention is not limited by the following description.

[Production of Ceria Slurry]

Figure 1A:
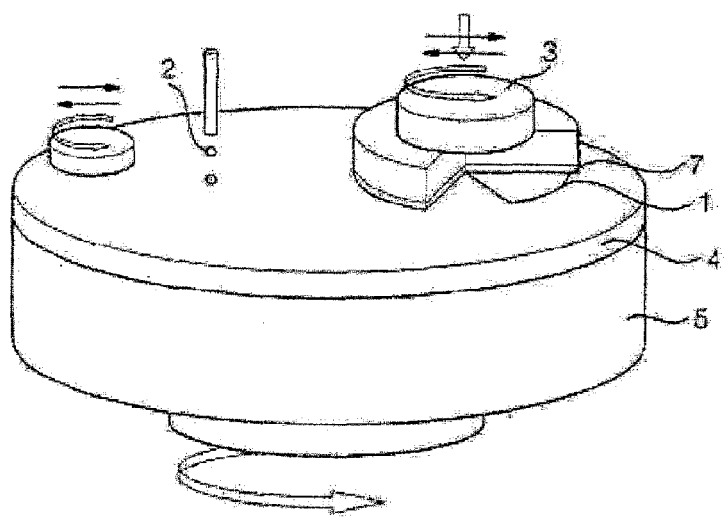
FIGS. 1a and 1b are a schematic perspective view and a schematic sectional view of a CMP device, respectively.
Figure 1B:
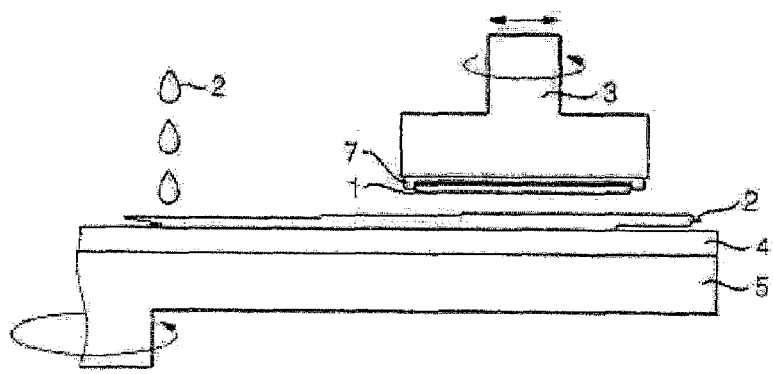
Figure 1C:
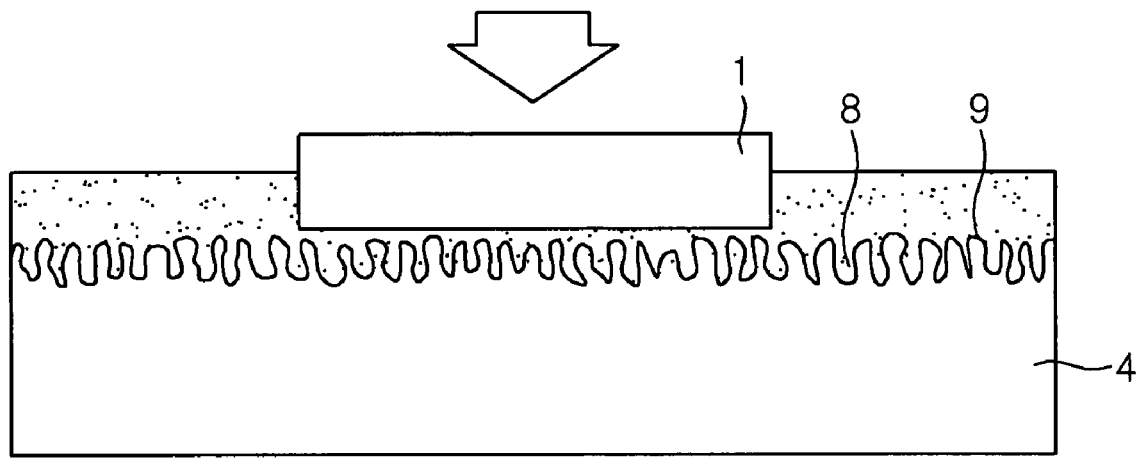
FIG. 1c is a schematic sectional view illustrating a CMP process.
Figure 2:
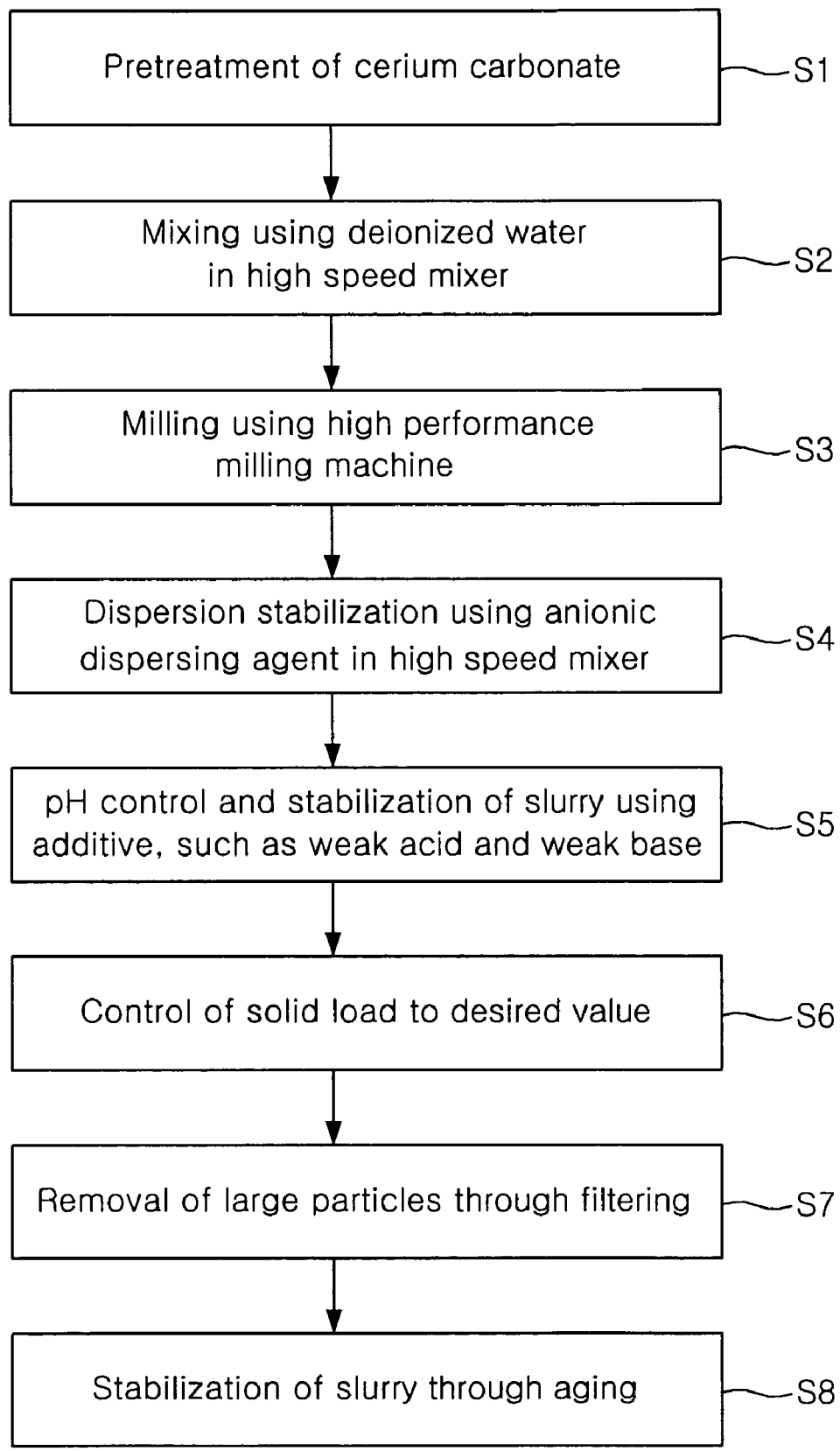
FIG. 2 is a flow chart illustrating the production of slurry according to the present invention.

The ceria slurry of the present invention is produced so as to contain ceria powder, deionized (DI) water, anionic polymer dispersing agent, and an additive such as a weak acid or weak base. A method of producing the polishing ceria slurry comprises the following steps (see FIG. 1). A precursor, such as cerium carbonate, is pre-treated, that is, synthesized in a solid phase to prepare the ceria powder (S1), the ceria powder is mixed and wetted with deionized (DI) water in a tank for mixing (S2), and the resulting mixture is milled using a milling machine so as to decrease the particle size and achieve distribution (S3). The anionic polymer dispersing agent is added to the slurry, which is produced according to the above procedure, to increase dispersion stability (S4), and the additive, such as the weak acid or weak base, is mixed with the mixture in a high speed mixer to control the pH and additional milling is conducted to stabilize the dispersion (S5). A weight ratio (wt %) of the slurry, that is, a solid load, is desirably set (S6), and large particles are removed through filtering to prevent the occurrence of scratches during precipitation and polishing (S7). Additional aging is conducted, thereby stabilizing the slurry (S8). The method of producing the polishing ceria slurry according to the present invention will be described in detail.

1. Production of Ceria Powder

A first stage of the production of the ceria slurry according to the present invention is to produce the ceria powder from a crude precursor through a solid-phase synthesis method. The precursor, such as cerium carbonate, is calcined to generate the ceria powder, and a separate drying process may be conducted to remove moisture before the calcination. The dried precursor is excellent in terms of transferring and processibility.

Properties of the ceria powder depend on the calcination conditions of cerium carbonate and the construction of a calcination device. Cerium carbonate has water of crystallization and adsorbed water, and water of crystallization typically has a valence of 4, 5, or 6. The calcination conditions depend on the number of water of crystallization and the amount of adsorbed water. After the calcination, water of crystallization and adsorbed water are removed.

Thereafter, temperature and heat treatment are increased to cause decarbonation, in which a carbonate functional group is removed in the form of carbon dioxide. Thereby, the ceria powder starts to be generated. Next, additional heat treatment is implemented to cause recrystalization, thereby creating the ceria powder, which consists of various sizes of particles. Water of crystallization and adsorbed water are removed at room temperature to 250° C., the decarbonation is conducted at 230° C. or more, and crystals start to be formed at 330° C. or more. Crystallization is achieved at a calcination temperature of 400~1,300° C., and preferably, 700~900° C.

Cohesion of the particles after calcination depends on the amount of adsorbed water and water of crystallization, and when the amount is great and they are insufficiently removed from a heating furnace, the cohesion increases.

Meanwhile, the crystallization degree and grain size depend on the crystallization temperature, and the grain size or the size of a single crystallite increases as the temperature of calcination for crystallization increases. As well, since the particle size distribution of the final ceria particles depends on the calcination temperature, it is possible to control the particle size and the particle size distribution of ceria by controlling a calcination condition, such as the calcination temperature. That is to say, the particle size distribution of the final ceria particles which depends on the calcination condition and the milling condition shows a bimodal peak-type particle size distribution which has a fine particle region and a large particle region. The particle size distribution depends on the calcination temperature. As disclosed in Korean Patent Application No. 10-2004-0016943 which has been filed by the applicant of the present invention, as the calcination temperature increases, the bimodal peaks are converted into sharp peaks and an area of a large particle region peak increases in comparison with a fine particle region peak. Meanwhile, in a bimodal particle size distribution which has two separated peaks representing fine and large polishing particles, the ratio of a fine particle peak area to a large particle peak area is controlled to produce a slurry which is capable of minimizing micro-scratches and has an excellent polishing speed. The ratio of the fine particle peak to the large polishing particle peak may be 5~25, preferably, the ratio of the fine particle peak to the large polishing particle peak may be 10~20, and more preferably, the ratio of the fine particle peak to the large polishing particle peak may be 12~18.

As described above, the particle size and the particle size distribution of ceria which are controlled depending on the calcination condition significantly affect the results of CMP. Therefore, in order to maximize a polishing rate of CMP and to minimize the occurrence of micro-scratches, it is necessary to control the particle size of ceria in the slurry so as to adjust the generation of large particles, and to optimally control a combination ratio of fine particles and large particles mixed in the slurry.

2. Mixing and Milling

The ceria powder, which is produced through the calcination process as described above, is mixed and wetted using deionized water and a high speed mixer. The mixture is milled using a high energy milling machine to reduce a particle size and disperse particles, thereby producing a nano-sized ceria slurry. Since the ceria slurry has many pores, mixing must be conducted for 10 min or more to achieve sufficient wetting. Preferably, premixing is conducted for one hour or more. An agitator of the mixer and an inside of a tank may be coated or lined with Teflon to prevent metal contamination.

The slurry is mixed with deionized water or purified water so that the concentration of polishing particles (ceria particles), that is, the solid load, is 5~40 wt %, and preferably, 10~30 wt %. The higher the solid load is, the higher the productivity is. However, if the solid load is maintained at a very high level, the viscosity of the slurry is very high and agglomeration frequently occurs, thus the milling efficiency is drastically reduced during the subsequent milling process or the milling process may be mechanically impossible.

After the above mixing, size reduction and distribution are conducted using a high energy milling machine so as to control the particle size and to distribute the cohering particles. The milling machine may be exemplified by a wet or dry milling machine. Since the dry milling machine may be contaminated by metal pieces caused by the abrasion of metal portions during the milling process, it is preferable to conduct the milling process using a wet milling machine made of ceramic. Meanwhile, when using a wet milling process, precipitation caused from the cohesion of the particles and reduction of milling efficiency may occur, and the presence of large particles and a size distribution having a large area may be likely to occur. Thus it is necessary to control the concentration of the polishing particles, to control a pH and conductivity, and to increase dispersion stability using a dispersing agent.

In the wet milling process using the ceria slurry, the milling process is conducted in such a way that beads having a size of 0.05~1.0 mm are packed in a volume of 20~80 vol % and a rotation speed per min of the high energy milling machine is controlled to 500~2,500 rpm, thereby producing the slurry having a desirable average secondary particle size distribution.

3. Dispersion Stability and Addition of an Additive

Figure 3:
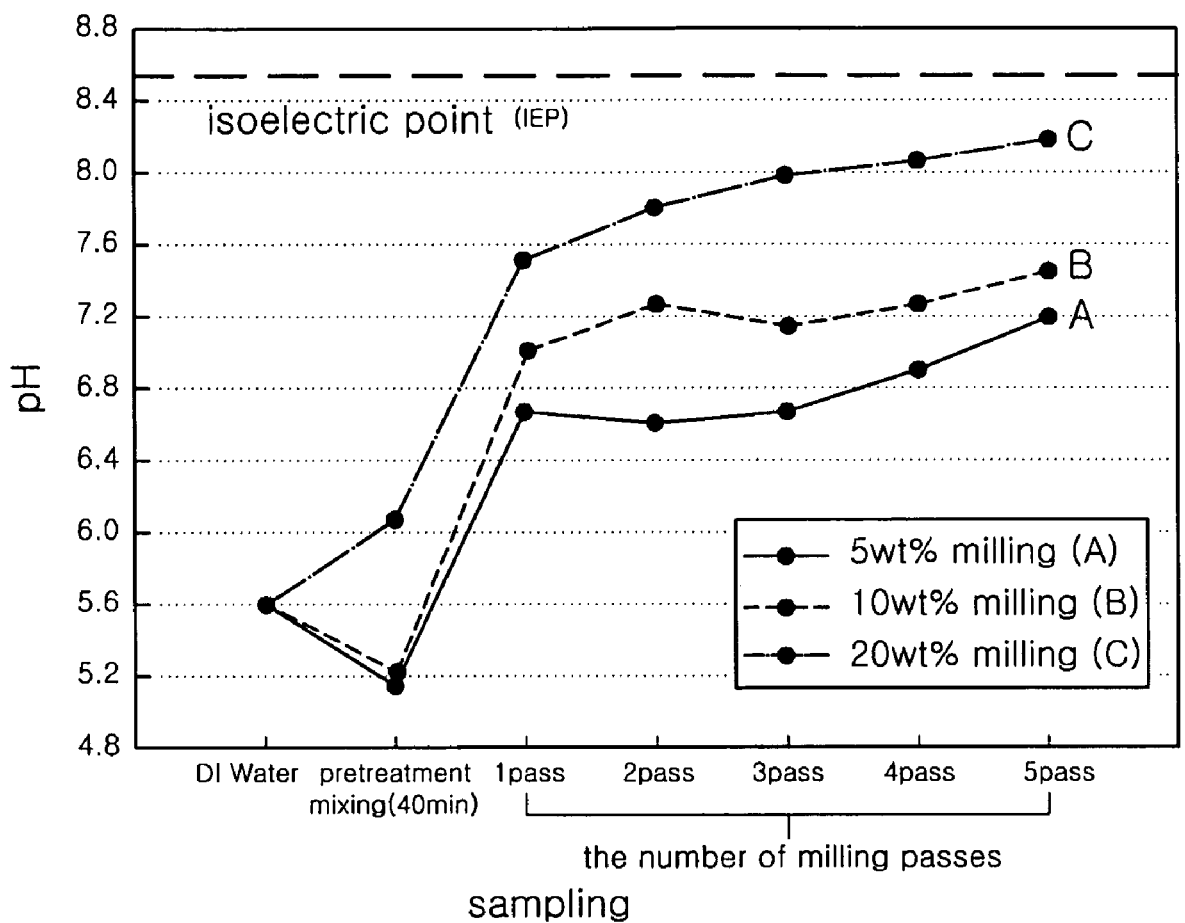
FIG. 3 is a graph showing pH as a function of milling number.

An anionic polymer dispersing agent is added to the slurry, and the additive, such as weak acid or weak base, is added thereto to control a pH, thereby stabilizing the slurry. FIG. 3 shows that the pH of the slurry approaches an isoelectric point (IEP), at which an electrokinetic sonic amplitude (ESA) becomes 0, in accordance with the repetition of the milling process. When the pH of the slurry approaches the point at which the electrokinetic sonic amplitude becomes 0, electric repulsive forces between the particles are reduced, which means that the possibility of cohesion of the particles increases. In other words, a zeta potential value is 0, causing the cohesion of the slurry. Particularly, if the solid load is 20 wt % or more, since the pH more rapidly approaches the IEP according to the repetition of the milling process in comparison with the milling process using the low solid load, cohesion occurs more frequently. Accordingly, in order to assure dispersion stability before the milling process and to prevent re-cohesion after the milling process, the milling process may be conducted after the pH of the slurry is controlled to deviate from the IEP and to correspond to acid such that dispersion stability is improved, or the milling process may be conducted after the polymer dispersing agent is added to improve dispersion stability. With respect to this, the anionic polymer dispering agent may be any one selected from the group consisting of polymethacrylic acid, ammonium polymethacrylate, polycarboxylate, sodium dodecylsulfate, alkylbenzenesulfonate, alpha-olefinsulfonate, sodium salts of monoalkyl phosphate and fatty acid, and carboxyl-acryl polymer, and a combination thereof.

After the dispersing agent is added, dispersion stability of the slurry is improved. The repulsive forces between the particles are increased in accordance with an increase in an absolute value of the electrokinetic sonic amplitude, so that precipitation of the slurry due to cohesion is prevented and stable dispersion is achieved. The mixing and dispersion are conducted for 10 min~24 hours. It is preferable to conduct the mixing and dispersion for 30 min or more in consideration of adsorption of polymer and stabilization of the pH, and to conduct the mixing and dispersion for 2 hours or more in consideration of aging.

Since the slurry of the present invention is water-soluble, solubility of a polymer compound in water at room temperature is desirable as a basic property. The amount of the anionic polymer compound is 0.0001~10.0 wt, preferably, 0.001~3.0 wt %, and more preferably, 0.02~2.0 wt % based on the weight of the polishing particles.

Meanwhile, if the dispersing agent to be added to the slurry contains cationic substances or cations contained in additives or the like are added to the slurry, the cationic substances are bonded to the anionic polymer dispersing agent, thereby reducing the absolute value of the electrokinetic sonic amplitude. This may cause re-cohesion between the particles in the dispersed slurry. Furthermore, since the charge density depends on the molecular weight, it is necessary to select the dispersing agent which has a high charge density and a proper molecular weight causing no re-cohesion. For example, it is preferable to use the anionic polymer dispersing agent having a molecular weight of 3,500~15,000 (g/mol). If the molecular weight of the dispersing agent is 50,000 (g/mol) or more, the re-cohesion between the particles is caused by a bridging phenomenon, thereby promoting the generation of large particles. Accordingly, it is preferable to use a dispersing agent having the molecular weight from 2,000~50,000 (g/mol).

Additionally, a pH controlling agent may be any one selected from the group consisting of a weak base or weak acid, such as ammonium hydroxide, tetra-methyl ammonium hydroxide, mono-ethanol amine, tri-ethanol amine, benzoic acid, lactic acid, acetic acid, hydrocyanic acid, or propionic acid, organic acid, such as polymethacrylic acid or polyacrylic acid, and a combination thereof.

It is preferable that the viscosity behavior of the stabilized ceria slurry be a Newtonian behavior. In other words, before dispersion is stabilized, viscosity of the slurry depends on the shear rate. On the other hand, after dispersion is stabilized, viscosity of the slurry shows Newtonian behavior, which is independent of the shear rate.

4. Control of the Solid Load (wt %) and Removal of the Large Particles

As described above, after a dispersion stabilization process of the slurry is completed, the solid load (wt %) of the ceria slurry is controlled within a desired range, and the large particles which may cause scratches during CMP and may cause precipitation and agglomeration are removed by filtering. When a great volume of the large particles exists, the gravitational force is larger than the dispersion force caused by the repulsive force between the particles, and surface areas of the large particles are smaller than those of the fine particles, thus dispersibility of the large particles is less than that of the fine particles. Particularly, since the number of particles per unit volume increases as the solid load increases, the occurrence of precipitation and agglomeration becomes serious. For the above two reasons, agglomeration and precipitation frequently occur, making the slurry unstable. Therefore, it is necessary to remove the large particles. Furthermore, the removal of the large particles increases as the number of repetitions of filtering for removing the large particles increases. However, the frequency of occurrence of agglomeration of the particles increases as the solid load increases, thus small particles are agglomerated to form the large particles. Accordingly, it becomes difficult to conduct the filtering, and even the small particles are filtered. Particularly, particles which are stored at a high solid load and thus agglomerate are disadvantageous in views of re-dispersion in comparison with a slurry having a low solid load. Therefore, it is necessary to disperse and filter the slurry before storage so that the appropriate solid load is maintained.

5. Aging of the Slurry

Stabilization of the slurry by aging is achieved by stirring the slurry in a tank for 24 hours so as to still further stabilize the slurry. This may be additionally conducted using the completed slurry, and may be omitted if necessary.

[Effects of the Solid Load of the Ceria Slurry]

Hereinafter, effects of the solid load of the ceria slurry, produced through the above-mentioned process, on properties of the slurry will be described.

If it is required to reduce the design rule of a semiconductor device and thus reduce the permitted limits to the number and the size of scratches, it is necessary to limit the number of large particles per unit volume of the slurry so as to be small. The solid load, which means a concentration of the slurry, significantly affects the number of large particles per unit volume.

Figure 4:
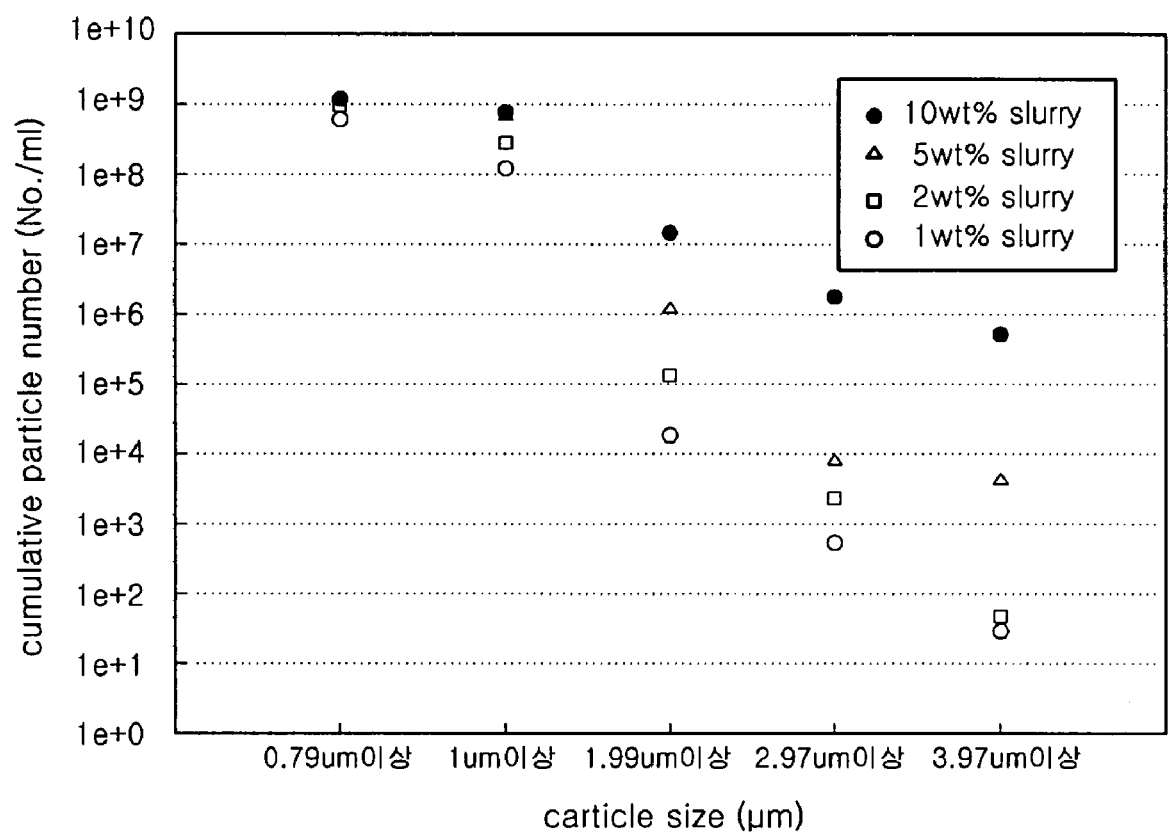
FIG. 4 is a graph showing the number of large particles as a function of solid load.

In the polishing slurry, if the solid load is low, the number of particles per unit volume decreases, thus decreasing the number of large particles per unit volume. However, even though the slurry is diluted so that the solid load is reduced to decrease the number of large particles, a decrease rate of the number of large particles depends on the particle size. That is to say, as shown in FIG. 4 which illustrates the number of particles as a function of the particle size according to a change in solid load, in the case of the large particles having the size of 0.79 μm or more, the number of large particles scarcely decreases even when the solid load is stepwise reduced from 10 wt % to 1 wt %. In the case of the large particles having the size of 1 μm or more, it can be seen that the number of large particles somewhat decreases or insignificantly decreases as the solid load is reduced. In the case of the large particles having the size of 1.99 μm or more, the number of large particles decreases as the solid load is reduced, and, in the case of the large particles having sizes of 2.97 μm or more, the number of large particles rapidly decreases as the solid load is reduced. In the case of the large particles having sizes of 3.97 μm or more, the number of large particles very rapidly decreases as the solid load is reduced.

The reason for the trend described above is that particles which are considered large particles may include one or two particles, or a plurality of relatively small agglomerated particles, and that the large particles including the plurality of agglomerated particles are larger than other large particles. In practice, as shown in FIG. 4, the large particles which are formed using the plurality of agglomerated particles are easily dispersed and become incohesive, thus being broken into the original small particles when the slurry is diluted. Hence, it can be seen that the number of large particles practically decreases more rapidly than an expected reduction speed of the number of large particles when the slurry is diluted.

Furthermore, the large particles causing occurrence of the micro-scratches mostly consist of one or two large particles instead of a plurality of relatively small agglomerated particles. If the large particles consisting of a plurality of small agglomerated particles are removed excessively, reduced productivity due to the reduced solid load or the reduced polishing speed is more significant than prevention of scratches. Therefore, when using the slurry with a variable solid load, it is preferable to maintain the appropriate number of large particles per unit volume according to the size of large particles so as to minimize the micro-scratches during polishing and to maintain the high polishing speed.

Additionally, the degree of agglomeration depends on the concentration of the slurry during storage. When the slurry is stored with the high solid load (high concentration), the number of large particles per unit volume is much more than that of the slurry stored with the low solid load (low concentration) (see FIG. 4). Thus, agglomeration and precipitation frequently occur, causing occurrence of the micro-scratches during polishing. As well, after the solid load of the slurry is controlled, it is relatively difficult to re-disperse the large particles which are formed through agglomeration and precipitation to form the small particles in comparison with the slurry which is dispersed and stored with the low solid load. Hence, it is necessary to store and forward the slurry so that the number of large particles and the solid load are appropriately controlled. Furthermore, since a decrease rate of the number of large particles which depends on the dilution condition of the slurry is changed according to the particle size and frequency of scratches is changed according to the particle size, it is necessary to separately control the numbers of the large particles having the sizes of 1 µm or more, 2 µm or more, and 3 µm or more instead of controlling particles having the size of 1 µm or more together. Particularly, as the particle size increases, the control must be more strictly conducted.

In the present invention, in order to produce the slurry which is capable of minimizing the occurrence of micro-scratches and maintaining the high polishing speed, the range of the number of large particles per unit volume of the slurry was controlled depending on the solid load and particle size ranges. That is to say, the range of the solid load of the slurry was set to 8~12 wt %, 6~8 wt %, 4~6 wt %, 2~4 wt %, and 0.5~2 wt %. Additionally, the number of large particles having the particle size of 0.79 µm or more, the number of large particles having the particle size of 0.99 µm or more, the number of large particles having the particle size of 1.99 µm or more, and the number of large particles having the particle size of 2.99 µm or more were controlled depending on the solid load ranges. The range of the number of large particles per unit volume (No./ml), which was suitably controlled depending on the solid load and the particle size, is described in the following Table 1.

TABLE 1

|  | 0.79 µm or more | 0.99 µm or more | 1.99 µm or more | 2.99 µm or more |
| --- | --- | --- | --- | --- |
| 8~12 wt % | $5 \times 10^8 \sim 5 \times 10^{10}$ | $1 \times 10^8 \sim 1 \times 10^{10}$ | $1 \times 10^7 \sim 1 \times 10^9$ | $1 \times 10^5 \sim 1 \times 10^7$ |
| 6~8 wt % | $5 \times 10^8 \sim 5 \times 10^{10}$ | $1 \times 10^8 \sim 1 \times 10^{10}$ | $5 \times 10^6 \sim 5 \times 10^8$ | $1 \times 10^4 \sim 1 \times 10^6$ |
| 4~6 wt % | $5 \times 10^8 \sim 5 \times 10^{10}$ | $1 \times 10^8 \sim 1 \times 10^{10}$ | $1 \times 10^6 \sim 1 \times 10^8$ | $1 \times 10^3 \sim 1 \times 10^5$ |
| 2~4 wt % | $5 \times 10^8 \sim 5 \times 10^{10}$ | $5 \times 10^7 \sim 5 \times 10^9$ | $5 \times 10^5 \sim 5 \times 10^7$ | $1 \times 10^2 \sim 1 \times 10^4$ |
| 0.5~2 wt % | $5 \times 10^8 \sim 5 \times 10^{10}$ | $5 \times 10^7 \sim 5 \times 10^9$ | $1 \times 10^5 \sim 1 \times 10^7$ | $5 \times 10^1 \sim 5 \times 10^3$ |

Additionally, the preferable range of the number of large particles per unit volume (No./ml), which was suitably controlled depending on the solid load and the particle size, is described in the following Table 2.

TABLE 2

|  | 0.79 µm or more | 0.99 µm or more | 1.99 µm or more | 2.99 µm or more |
| --- | --- | --- | --- | --- |
| 8~12 wt % | $1 \times 10^9 \sim 1 \times 10^{10}$ | $5 \times 10^8 \sim 5 \times 10^9$ | $5 \times 10^7 \sim 5 \times 10^8$ | $5 \times 10^5 \sim 5 \times 10^6$ |
| 6~8 wt % | $1 \times 10^9 \sim 1 \times 10^{10}$ | $5 \times 10^8 \sim 5 \times 10^9$ | $1 \times 10^7 \sim 1 \times 10^8$ | $5 \times 10^4 \sim 5 \times 10^5$ |
| 4~6 wt % | $1 \times 10^9 \sim 1 \times 10^{10}$ | $5 \times 10^8 \sim 5 \times 10^9$ | $5 \times 10^6 \sim 5 \times 10^7$ | $5 \times 10^3 \sim 5 \times 10^4$ |
| 2~4 wt % | $1 \times 10^9 \sim 1 \times 10^{10}$ | $1 \times 10^8 \sim 1 \times 10^9$ | $1 \times 10^6 \sim 1 \times 10^7$ | $5 \times 10^2 \sim 5 \times 10^3$ |
| 0.5~2 wt % | $1 \times 10^9 \sim 1 \times 10^{10}$ | $1 \times 10^8 \sim 1 \times 10^9$ | $5 \times 10^5 \sim 5 \times 10^6$ | $1 \times 10^2 \sim 1 \times 10^3$ |

Additionally, the more preferable range of the number of large particles per unit volume (No./ml), which was suitably controlled depending on the solid load and the particle size, is described in the following Table 3.

TABLE 3

|  | 0.79 µm or more | 0.99 µm or more | 1.99 µm or more | 2.99 µm or more |
| --- | --- | --- | --- | --- |
| 8~12 wt % | $2 \times 10^9 \sim 5 \times 10^9$ | $7 \times 10^8 \sim 1 \times 10^9$ | $7 \times 10^7 \sim 1 \times 10^8$ | $7 \times 10^5 \sim 1 \times 10^6$ |
| 6~8 wt % | $2 \times 10^9 \sim 5 \times 10^9$ | $7 \times 10^8 \sim 1 \times 10^9$ | $2 \times 10^7 \sim 5 \times 10^7$ | $7 \times 10^4 \sim 1 \times 10^5$ |
| 4~6 wt % | $2 \times 10^9 \sim 5 \times 10^9$ | $7 \times 10^8 \sim 1 \times 10^9$ | $7 \times 10^6 \sim 1 \times 10^7$ | $7 \times 10^3 \sim 1 \times 10^4$ |
| 2~4 wt % | $2 \times 10^9 \sim 5 \times 10^9$ | $2 \times 10^8 \sim 5 \times 10^8$ | $2 \times 10^6 \sim 5 \times 10^6$ | $7 \times 10^2 \sim 1 \times 10^3$ |
| 0.5~2 wt % | $2 \times 10^9 \sim 5 \times 10^9$ | $2 \times 10^8 \sim 5 \times 10^8$ | $7 \times 10^5 \sim 1 \times 10^6$ | $2 \times 10^2 \sim 5 \times 10^2$ |

[Change in the Number of Large Particles Depending on the Solid Load]

In the following, the ceria powder and the slurry are produced under predetermined conditions (change in the solid load) through the above-mentioned method, and the properties of the polishing powder and the slurry, such as the number of large particles depending on the particle size of the slurry produced under the conditions, are analyzed. Analysis equipment is as follows.

1) Particle size distribution: measured using APS manufactured by Matec Applied Science Co. in the USA 2) Electrokinetic sonic amplitude (dispersion stability): measured using ESA 9800 manufactured by Matec Applied Science Co. in the USA 3) Viscosity: measured using a Brookfield viscometer, DVII+

4) pH: measured using a pH meter manufactured by Orion, Inc. in the USA

Figure 5:
FIG. 5 is a TEM picture of ceria powder calcined at 750° C.

1. Preparation of Ceria Powder 75 kg of highly pure cerium carbonate was charged in a container having a weight of 800 g, and calcined in a calcination furnace at 750° C. for 4 hours. Spontaneous cooling was conducted in such a way that gas flowed at a rate of 20 m$^3$/hr to effectively remove $CO_2$ generated as a byproduct. The calcined ceria powder was analyzed by X-ray diffraction, confirming that highly pure cerium oxide was produced. Furthermore, the powder was analyzed using a TEM, and the grain size was about 40 nm (see FIG. 5).

2. Preparation of Ceria Slurries 1 to 3

To prepare the ceria slurry 1, 10 kg of synthesized highly pure ceria powder and 90 kg of deionized water were mixed with each other for 1 hour or more in a high speed mixer so as to achieve sufficient wetting, and the mixture, that is, 10 wt % slurry, was subjected to a milling process so that a median size of second particles was 200 nm. Through the milling process, a particle size was controlled to a desired range and agglomerated particles in the slurry were dispersed. Subsequently, a polymer-based dispersing agent as an anionic additive was added in an amount of 1 wt % based on the ceria powder, and mixing was conducted for 2 hours or more so as to assure sufficient adsorption, thus dispersion was achieved. Thereafter, the solid load was maintained to be 10 wt %, and filtering was then conducted, thereby creating the ceria slurries. The ceria slurries 2 and 3 were prepared through the procedure that was the same as the above-mentioned procedure except that the solid load was maintained to be 5 wt % and 2.5 wt % after the dispersion process and the filtering was then conducted to create the ceria slurries.

The numbers of large particles of the ceria slurries 1 to 3, which depended on the corresponding solid loads, were set to be within the above-mentioned range of the number of large particles by controlling the milling, dispersion, and filtering processes.

3. Comparison of the Ceria Slurries 1 to 3

First, viscosities and electrokinetic sonic amplitudes were measured to evaluate dispersion stability, resulting in the finding that the ceria slurries 1 to 3 showed Newtonian behaviors and sufficient repulsion forces between particles. Therefore, it was confirmed that 1 wt % polymer-based dispersing agent sufficiently dispersed the slurries. The number of large particles per unit volume of each of the ceria slurries 1 to 3 (No./ml), which depended on particle size, was measured, and the results are described in the following Table 4.

TABLE 4

| | Solid load | 0.79 μm or more | 0.99 μm or more | 1.99 μm or more | 2.99 μm or more | 3.97 μm or more |
|---|---|---|---|---|---|---|
| Slurry 1 | 10 wt % | 1,651,667,302 | 698,422,082 | 15,114,325 | 2,085,587 | 544,858 |
| Slurry 2 | 5 wt % | 1,819,672,612 | 649,084,250 | 1,304,698 | 8,650 | 3,802 |
| Slurry 3 | 2.5 wt % | 1,330,223,565 | 271,543,773 | 142,401 | 2,408 | 25 |

[CMP Test Results]

An object was polished using the ceria slurries produced as described above, and, in this case, the removal rate, the number of scratches, and polishing selectivity were evaluated. CMP polishing performance tests for the object were carried out using the ceria slurries 1 to 3 produced as described above. The solid load was controlled to be 1 wt % right before CMP, and the tests were then conducted. 6EC manufactured by Strasbaugh, Inc. in the USA was used as a CMP device. An 8" wafer, on which PE-TEOS (plasma enhanced chemical vapor deposition TEOS oxide) was applied to form an oxide film on the entire surface thereof, and another 8" wafer, on which $Si_3N_4$ was applied to form a nitride film on the entire surface thereof, were used as an object wafer. Test conditions and consumption substances were as follows:

1) Pad: IC1000/SUBAIV (purchased from Rodel, Inc. in the USA)

2) Device for measuring a film thickness: Nano-Spec 180 (purchased from Nano-metrics, Inc. in the USA)

3) Table speed: 70 rpm

4) Spindle speed: 70 rpm

5) Down force: 4 psi

6) Back pressure: 0 psi

7) Amount of slurry supplied: 100 mΩ/min

8) Measurement of residual particles and scratches: measured using Surfscan SP1 manufactured by KLA-Tencor, Inc. in the USA.

Surfaces of the wafers, on which the oxide film (PE-TEOS) and the nitride film (Si3N4) were formed, were polished using the polishing slurries, which were produced under the conditions given in examples 1 to 11, for 1 min. The removal rate was determined from a thickness change of the polished film, and the micro-scratches were measured using Surfscan SP1. Polishing performance for the slurries was tested in such a way that polishing characteristics were measured after a blank wafer was polished three times or more. Averages of the measured values are described in the following Table 5.

TABLE 5

| | Solid load during slurry storage (wt %) | Removal rate of oxide film (Å/min) | Removal rate of nitride film (Å/min) | Removal ratio of oxide film:nitride film (selective ratio) | WIWNU (%) | Oxide film residual particles (No.) | Scratches (No.) |
|---|---|---|---|---|---|---|---|
| Slurry 1 | 10 | 2520 | 48 | 52.5 | 1.0 | 382 | 2 |
| Slurry 2 | 5 | 2617 | 49 | 53.4 | 1.1 | 317 | 0 |
| Slurry 3 | 2.5 | 2620 | 47 | 55.7 | 1.1 | 259 | 0 |
| Com. Exam. (conventional technology) | 5 | 2404 | 46 | 52.3 | 1.2 | 430 | 3 |

As described above, after the slurries 1 to 3, which are produced so as to have different solid loads, are subjected to filtering, it is possible to control the number of large polishing particles in the slurry depending on the particle size (see Table 4). CMP was conducted using the slurries 1 to 3 in which the numbers of large particles are controlled under the same conditions, and the CMP results according to the conditions are described in Table 5. The slurries 1 to 3 all have the fair removal rate and removal selectivity (removal ratio of the oxide film to the nitride film), and also excellent within-wafer-nonuniformity (WIWNU) which indicates removal uniformity of the polished wafer during the polishing process. However, in the case of the slurry 1, since the filtering is conducted with the high solid load, small particles are filtered, thus the removal rate of the oxide film is slightly reduced. Meanwhile, the slurries 1 to 3 all are within permitted limits to the number of residual particles and cause very few scratches, thereby assuring excellent performance. When the slurry is produced, dispersed, and stored while the solid load is low, re-dispersion of the slurry is relatively desirably conducted, thus it is observed that the numbers of oxide film residual particles and scratches decrease. Accordingly, in the present invention, it is possible to produce a high performance polishing slurry by controlling the solid load in the slurry and the number of large particles depending on the particle size.

As described above, in the present invention, it is possible to produce a slurry having excellent physical properties which are essential in a polishing agent for a CMP process during fabrication of a semiconductor. Particularly, it is possible to decrease scratches and residual particles which cause fatal defects in a device after CMP.

Furthermore, in the present invention, it is possible to develop a slurry which is capable of reducing defects of a device and maintaining a high removal rate during a CMP process by controlling a solid load of the slurry.

As well, in the present invention, it is possible to produce a high performance slurry as a polishing agent for CMP. When the slurry is used as the polishing agent for CMP, it can be applied to various patterns required in the course of producing ultra highly integrated semiconductors, and thus excellent removal rate, removal selectivity, and within-wafer-nonuniformity (WIWNU), which indicates removal uniformity, as well as minimal occurrence of micro-scratches, can be assured.

What is claimed is:

1. A polishing slurry comprising:
polishing particles dispersed within the slurry,
wherein a solid load of the slurry is 0.5~12 wt %, and
wherein the cumulative number of polishing particles having a particle size of 0.79 μm or more is $5 \times 10^8$/ml~$5 \times 10^{10}$/ml, the cumulative number of polishing particles having a particle size of 0.99 μm or more is $5 \times 10^7$/ml~$1 \times 10^{10}$/ml, the cumulative number of polishing particles having a particle size of 1.99 μm or more is $1 \times 10^5$/ml~$1 \times 10^9$/ml, and the cumulative number of polishing particles having a particle size of 2.99 μm or more is $5 \times 10^1$/ml~$1 \times 10^7$/ml.

2. The polishing slurry as set forth in claim 1, wherein the solid load of the slurry is 8~12 wt %, the cumulative number of polishing particles having a particle size of 0.79 μm or more is $5 \times 10^8$/ml~$5 \times 10^{10}$/ml, the cumulative number of polishing particles having a particle size of 0.99 μm or more is $1 \times 10^8$/ml~$1 \times 10^{10}$/ml, the cumulative number of polishing particles having a particle size of 1.99 μm or more is $1 \times 10^7$/ml~$1 \times 10^9$/ml, and the cumulative number of polishing particles having a particle size of 2.99 μm or more is $1 \times 10^5$/ml~$1 \times 10^7$/ml.

3. The polishing slurry as set forth in claim 1, wherein the solid load of the slurry is 6~8 wt %, the cumulative number of polishing particles having a particle size of 0.79 μm or more is $5 \times 10^8$/ml~$5 \times 10^{10}$/ml, the cumulative number of polishing particles having a particle size of 0.99 μm or more is $1 \times 10^8$/ml~$1 \times 10^{10}$/ml, the cumulative number of polishing particles having a particle size of 1.99 μm or more is $5 \times 10^6$/ml~$5 \times 10^8$/ml, and the cumulative number of polishing particles having a particle size of 2.99 μm or more is $1 \times 10^4$/ml~$1 \times 10^6$/ml.

4. The polishing slurry as set forth in claim 1, wherein the solid load of the slurry is 4~6 wt %, the cumulative number of polishing particles having a particle size of 0.79 μm or more is $5 \times 10^8$/ml~$5 \times 10^{10}$/ml, the cumulative number of polishing particles having a particle size of 0.99 μm or more is $1 \times 10^8$/ml~$1 \times 10^{10}$/ml, the cumulative number of polishing particles having a particle size of 1.99 μm or more is $1 \times 10^6$/ml~$1 \times 10^8$/ml, and the cumulative number of polishing particles having a particle size of 2.99 μm or more is $1 \times 10^3$/ml~$1 \times 10^5$/ml.

5. The polishing slurry as set forth in claim 1, wherein the solid load of the slurry is 2~4 wt %, the cumulative number of polishing particles having a particle size of 0.79 μm or more is $5 \times 10^8$/ml~$5 \times 10^{10}$/ml, the cumulative number of polishing particles having a particle size of 0.99 μm or more is $5 \times 10^7$/ml~$5 \times 10^9$/ml, the cumulative number of polishing particles having a particle size of 1.99 μm or more is $5 \times 10^5$/ml~$5 \times 10^7$/ml, and the cumulative number of polishing particles having a particle size of 2.99 μm or more is $1 \times 10^2$/ml~$1 \times 10^4$/ml.

6. The polishing slurry as set forth in claim 1, wherein the solid load of the slurry is 0.5~2 wt %, the cumulative number of polishing particles having a particle size of 0.79 μm or more is $5 \times 10^8$/ml~$5 \times 10^{10}$/ml, the cumulative number of polishing particles having a particle size of 0.99 μm or more is $5 \times 10^7$/ml~$5 \times 10^9$/ml, the cumulative number of polishing particles having a particle size of 1.99 μm or more is $1\times10^5$/ml~$1\times10^7$/ml, and the cumulative number of polishing particles having a particle size of 2.99 μm or more is $5\times10^1$/ml~$5\times10^3$/ml.

7. The polishing slurry as set forth in claim 1, wherein the polishing particles are ceria, and the ceria is produced through a solid-phase synthesis process.

8. The polishing slurry as set forth in claim 1, wherein the slurry comprises deionized water and an anionic polymer compound.

9. The polishing slurry as set forth in claim 8, wherein the anionic polymer compound is selected from the group consisting of polymethacrylic acid, ammonium polymethacrylate, polycarboxylate, sodium dodecylsulfate, alkylbenzenesulfonate, alpha-olefinsulfonate, sodium salts of monoalkyl phosphate and fatty acid, and carboxyl-acryl polymer.

* * * * *

UNITED STATES PATENT AND TRADEMARK OFFICE
CERTIFICATE OF CORRECTION

PATENT NO. : 7,364,600 B2 Page 1 of 1
APPLICATION NO. : 11/127441
DATED : April 29, 2008
INVENTOR(S) : Dae Hyeong Kim et al.

It is certified that error appears in the above-identified patent and that said Letters Patent is hereby corrected as shown below:

Column 5, line 48, the word "polymethacrylate" should read -- polymer compound --;
Column 5, line 49, the word "polymethacrylie" should read -- polymethacrylic --;
Column 8, lines 54-60, should be a new paragraph beginning with the words "With respect to…" and ending with the words "… combination thereof.";
Column 8, line 55, the word "dispering" should read -- dispersing --;
Column 8, line 59, the words "and fatty" should read -- fatty --;
Column 8, line 59, the words "and carboxyl-acryl" should read -- carboxyl-acryl --;
Column 14, line 53, the word "mΩ/min" should read -- mℓ/min --.

Signed and Sealed this

Seventeenth Day of March, 2009

JOHN DOLL
*Acting Director of the United States Patent and Trademark Office*